(12) United States Patent
Yllana, Jr. et al.

(10) Patent No.: US 12,704,546 B2
(45) Date of Patent: Aug. 11, 2026

(54) TEST LOAD BOARD

(71) Applicant: TEXAS INSTRUMENTS INCORPORATED, Dallas, TX (US)

(72) Inventors: Pastor Jose Yllana, Jr., Baguio City (PH); Dale Ohmart, Richmond, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 180 days.

(21) Appl. No.: 18/497,607

(22) Filed: Oct. 30, 2023

(65) Prior Publication Data

US 2025/0138087 A1 May 1, 2025

(51) Int. Cl.
*G01R 31/28* (2006.01)
*G06K 19/07* (2006.01)

(52) U.S. Cl.
CPC ..... *G01R 31/2896* (2013.01); *G06K 19/0723* (2013.01)

(58) Field of Classification Search
USPC .................................................... 324/762.02
See application file for complete search history.

(56) References Cited

U.S. PATENT DOCUMENTS

2007/0080677 A1 4/2007 Weinraub
2007/0205753 A1 9/2007 Hsu et al.
2009/0184725 A1* 7/2009 Tunaboylu ......... H01R 12/7076 324/754.07
2016/0187277 A1* 6/2016 Potyrailo ............. G01N 27/026 324/633

* cited by examiner

*Primary Examiner* — Farhana A Hoque
(74) *Attorney, Agent, or Firm* — Ronald O. Neerings; Frank D. Cimino

(57) ABSTRACT

A test load board includes a PCB (printed circuit board) with pads for a probe of a tester. The test load board also includes a contactor that includes contact points for connecting leads of a DUT (device under test). The test load board further includes an RFID (radio frequency identification) tag affixed to the PCB. The RFID tag is loaded with a unique identifier (ID) of the test load board.

20 Claims, 9 Drawing Sheets

TEST LOAD BOARD

TECHNICAL FIELD

The description relates to a test load board for testing integrated circuit (IC) packages.

BACKGROUND

Semiconductor devices such as ICs are often subject to testing. Testing presents many technical challenges to adequately verify the operation of the device under test (DUT) and to minimize false readings due to the test conditions. False readings based on the test conditions include faulty test load boards resulting in erroneous test readings for the DUT. Erroneous readings can lead to the rejection of serviceable devices or failure to detect defective devices. Both problems potentially result in increased costs.

SUMMARY

A first example is related to a test load board. The test load board includes a PCB (printed circuit board) with pads for a probe of a tester. The test load board also includes a contactor that includes contact points for connecting leads of a DUT (device under test). The test load board further includes an RFID (radio frequency identification) tag affixed to the PCB. The RFID tag is loaded with a unique identifier (ID) of the test load board.

A second example is related to a non-transitory machine-readable medium having machine-readable instructions for a test load board manager causing a processor core to execute operations. The operations include providing a query for a unique ID for a test load board to a RFID reader. The RFID reader generates a wireless signal to query an RFID tag on the test load board responsive to receiving the query. The operations also include receiving the unique ID for the test load board in response to the providing. The operations further include querying a database for a record of the test load board based on the unique ID of the test load board.

A third example is related to a method for testing integrated circuit (IC) packages. The method includes scanning, with a RFID reader, an RFID tag mounted on a test load board with a PCB with pads for a probe of a tester and a contactor that includes contact points for connecting a leads of a DUT. The method also includes determining, with test load board manager operating on a computing platform, a unique ID of the load board based on the scanning. The method further includes inserting, by a handler, an IC package in the contactor. The method yet further includes testing, by a tester, the inserted IC package.

DETAILED DESCRIPTION

Test load boards are used for testing the operation of a device under test (DUT). The test load board is a mechanical and circuit interface that connects automatic test equipment (ATE) to the DUT. As the interface between the ATE and the DUT, the test load board typically contains the components required to prepare the DUT for testing, route the test and response signals between the DUT and the ATE, and in some cases to provide additional test capabilities not provided for in the ATE design. For example, the DUT on the test load board electrically stimulates and monitors the electrical response. The ATE stimulates the DUT by providing electrical signals to the DUT's input pins and then monitoring the resultant electrical signals provided from the DUT on its output pins. The test load board includes a printed circuit board (PCB) with a test socket for receiving the DUT, as well as an assortment of interconnected components (e.g., ICs, resistors, capacitors, relays, and connectors, among others) that make up the test circuitry. Given the numerous interconnected components, there are various failure points for the test load boards.

If the test load board is faulty, the failure rate of DUTs being tested is improperly skewed and including false negatives or positives for the DUT. For example, a defective test load board generates false-positive results for faulty DUTs and causes a faulty DUT to be shipped or mounted in a device. Alternatively, a defective test load board generates false-negative results for nominal DUTs and cause a nominal DUT to be discarded despite being operational. If a test load board is associated with a failure rate greater or lower than a predicted range, the test load board itself may be faulty. However, because various test load boards are used, the skewed failure rate may not be detected. Even if the skewed failure rate is detected, the failure rate is not traceable to a specific test load board.

Here, the test load boards have unique identifiers so that a failure rate is associated with the test load board that was used to test the DUTs corresponding to the failure rate. For example, an RFID (radio frequency identification) tag is affixed to the PCB. The RFID tag is loaded with a unique identifier (ID) of the test load board. Accordingly, the test load board is assigned a unique identifier that can be used to track the failure rate of DUTs tested by the test load board. Thus, issues with the test load board can be identified earlier such that fewer faulty DUTs are shipped and mounted and fewer nominal DUTs are discarded.

Figure 1:
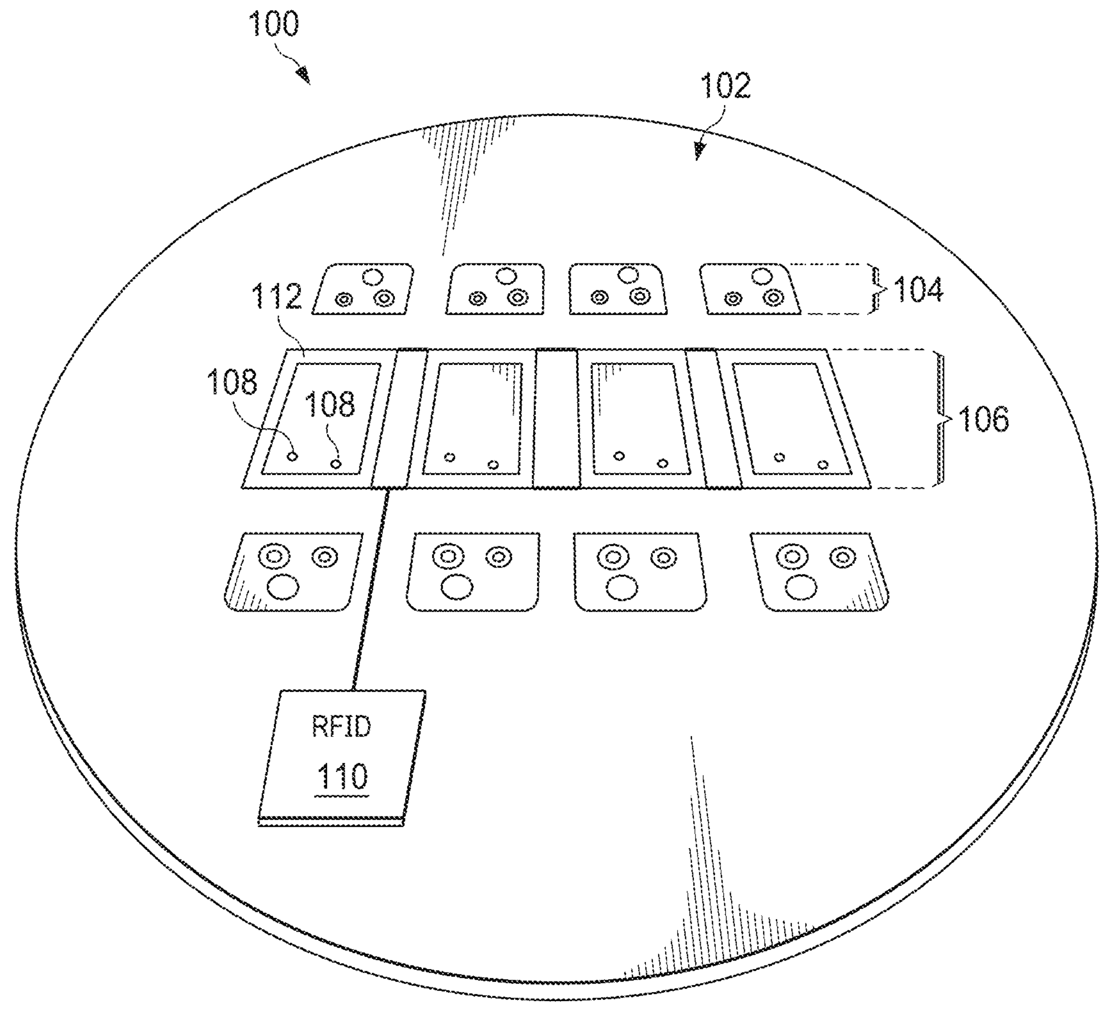
FIG. 1 illustrates an example of a test load board with an RFID (radio frequency identification) tag.

FIG. 1 illustrates an example of a test load board 100 that is configured to be loaded with devices under test (DUT) that are being tested in automatic test equipment (ATE) such as a tester. Therefore, the test load board 100 is an interface between the DUT and ATE. The test load board 100 includes a PCB (printed circuit board) 102 having a set of pads 104. The PCB includes circuitry for testing the DUTs. For example, a set of pads include pads (e.g., pad-1 104, pad-2 104 . . . pad-K 104) are mounted to the PCB 102. The set of pads 104 receive electrical signals from probes of the tester.

The test load board 100 has a set of contactor pads 106 including contactors (e.g., contactor pad-1 106, contactor pad-2 106 . . . contactor pad-K 106). The contactor pads 106 include circuitry (e.g., traces) for mounting contactors that have sockets for testing IC (integrated circuit) packages. In one example, the set of contactor pads 106 enable mounting of a single contactor for the PCB 102. As another example, the set of contactor pads 106 enable mounting of multiple contactors concurrently. The contactor pads 106 have a first surface that substantially faces the PCB 102 and a second surface opposite the first surface of the contactor pads 106. The second surface substantially faces a DUT. In one example, the contactor pads 106 have one or more layers, such as a ceramic layer, a conductive layer, etc. As another example, the contactor pads 106 include a number of tiles.

The contactor pads 106 includes contact points 108 for connecting leads of a DUT through a mounted contactor. The contact points 108 are held in an arrangement of contact points 108 for the contactor. The contact points 108 have a wide variety of physical characteristics that vary depending upon a particular implementation of the DUT or the tester. For example, the contact points 108 have a wide variety of shapes, such as straight, bent, curved, etc. As another example, the contact points 108 have uniform or varying thickness or cross-sectional area.

The contact points 108 of the contactor pads 106 provide electrical paths between the DUT and the PCB 102 and through the PCB 102 to a corresponding pad 104. For example, a DUT in contact with the contact points 108 of the contactor pad-1 106 transmits and receives electrical signals from the tester via the pad-1 104. The electrical paths are implemented in a variety of ways, depending upon a particular implementation. For example, the electrical paths are implemented by vias and/or traces on and/or through the contactor pads 106.

The test load board 100 further includes an RFID (radio frequency identification) tag 110 affixed to the PCB 102. The RFID tag 110 is permanently or removably attached to the PCB 102. The RFID tag 110 is associated with identification information about the test load board 100, such as a unique identifier (ID). In some examples, the identification information includes a revision number and a manufacturing code for the test load board 100. The manufacturing code uniquely identifies a manufacturer of the test load board 100. In one example, the identification information is optically readable information that is formed on the surface of the RFID tag 110. In one example, the RFID tag 110 is affixed to the PCB 102 with adhesive. In another example, the RFID tag 110 includes an integrated circuit encoded with the identification information. In some examples, the RFID tag 110 stores identification information, modulate and demodulate a radio-frequency (RF) signal, and/or perform other specialized functions.

The RFID tag 110 wirelessly transmits the identification information of the test load board 100 in response to a query from an RFID reader. In one example, an antenna 112 is coupled to the RFID tag 110. The antenna 112 is formed from a conductive material, such as copper, embedded in a flexible dielectric material on the PCB 102. The antenna 112 is shaped to circumscribe the contactor pads 106 and the contactor mounded thereon. The antenna 112 transmits the power and captures the return signal from the RFID tag 110 with the identification information. For example, the antenna 112 receives an RF signal and forms an electric and magnetic field from which the RFID tag 110 draws power for the integrated circuit. Therefore, the RFID reader can receive the identifier information by optically scanning or wirelessly interrogating the RFID tag 110. The identification information, such as the unique identifier, are used to track the failure rate of DUTs tested by the test load board 100.

Figure 2:
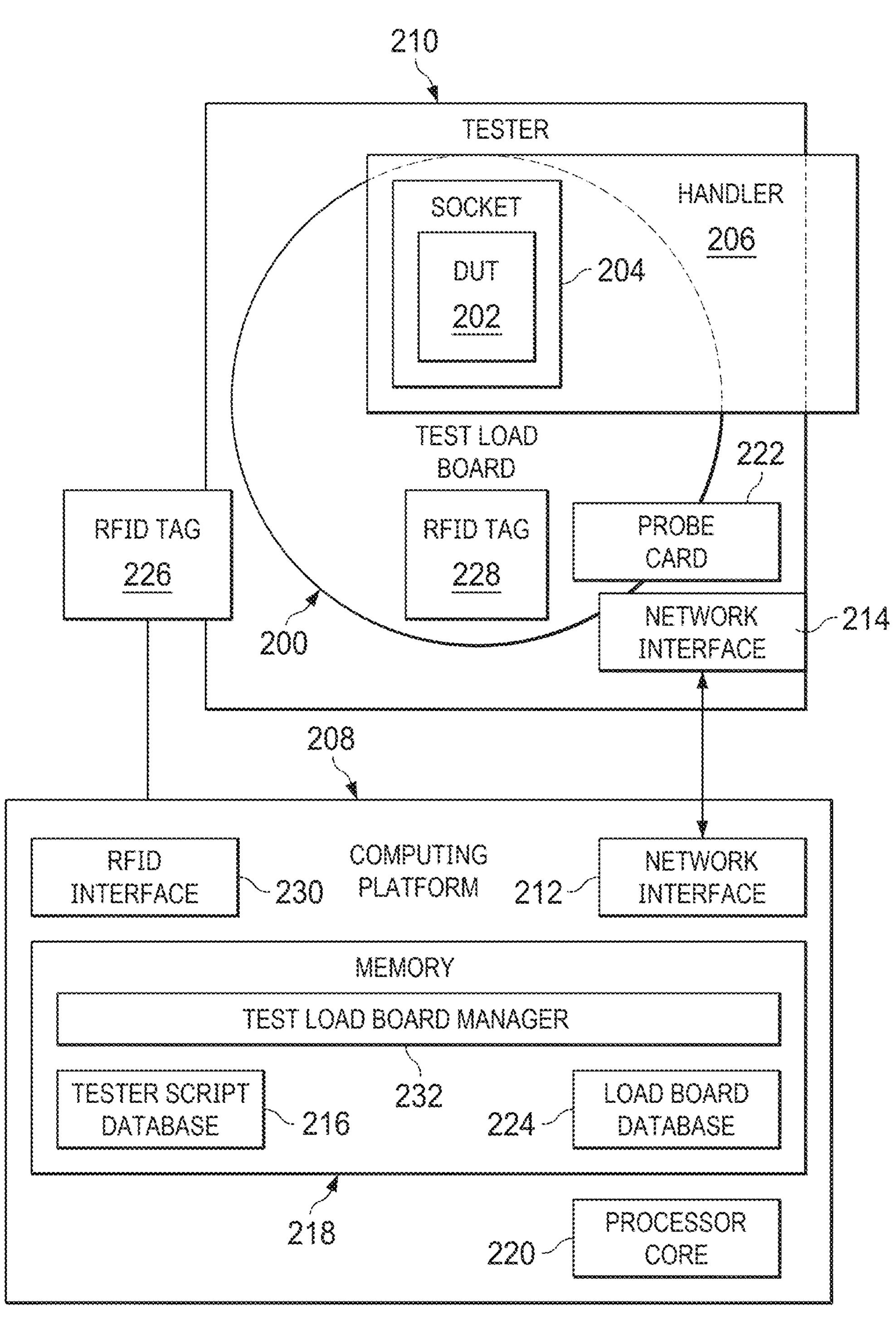
FIG. 2 illustrates an example of an operating environment for a test load board with an RFID tag.

FIG. 2 illustrates an example of an operating environment for a test load board 200 for testing a device under test (DUT) 202. The DUT 202 is an electronic device such as an integrated circuit (IC) package, a die on a wafer, or a resulting packaged part of an IC. The testing is performed when the DUT 202 is first manufactured and/or later during the life cycle of the DUT 202 as part of ongoing functional testing and calibration checks.

The DUT 202 is received by the socket 204 of the contactor mounted on contactor pads (e.g., the contactor pads 106 of FIG. 1). The contactor includes a socket 204 adapted to receive the DUT 202. In the example illustrated, the socket 204 and the contactor are coextensive. In other examples, a contactor includes multiple sockets (including multiple instances of the socket 204). The socket 204 physically and electrically supports the DUT 202 and holds the DUT 202 in position on the contactor during testing. In some examples, the socket 204 includes a number of carrier features (e.g., walls, clips, mounts, plates, etc.) that allow the DUT 202 to be removably attached to the contactor.

During a handling stage, the DUT 202 is positioned in the socket 204 by a handler 206 and held in a predetermined position for the duration of testing. For example, the handler 206 applies a pressing force on the DUT 202 in the direction of the socket 204 of the contactor. While held in the socket 204, contact surfaces on the DUT 202 make contact with contact points (e.g., the contact points 108) in the socket 204. The socket 204 and the contact points are included in the contactor mounted on the contactor pads (e.g., the contactor pads 106 of FIG. 1).

In response to the handler 206 loading the DUT 202 into the socket 204, a computing platform 208 causes a tester 210 to test the DUT 202. The computing platform 208 communicates through a network interface 212 of the computing platform 208 to a network interface 214 of the tester 210. The communication can be, for example, a network transfer, a file transfer, an applet transfer, an email, a hypertext transfer protocol (HTTP) transfer, and so on. The communication can occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, and a packet switching system, among others.

The computing platform 208 accesses a tester script database 216 for test instructions stored in a memory 218 of the computing platform 208. The memory 218 can include volatile memory and/or nonvolatile memory. The memory 218 stores an operating system that controls or allocates resources of the computing platform 208. For example, the test instructions from the tester script database 216 of the memory 218 cause a processor core 220 to execute the test instructions as operations. Instructions processed by the processor core 220 can include digital signals, data signals, instructions, messages, a bit, a bit stream, that can be received, transmitted and/or detected. For example, a non-transitory machine-readable medium having machine-readable instructions causes the processor core 220 to execute operations. The processor core 220 can be a variety of various processors including multiple single and multicore processors and co-processors and other multiple single and multicore processor and co-processor architectures.

The test instructions cause the tester 210 to bring a probe of a probe card 222 into contact with a pad (e.g., the pad 104 of FIG. 1) corresponding to the socket 204 in the testing phase. As one example, the probe card 222 is an inclination type probe card in which probes are radially arranged on a substrate at an angle. In another example, the probe card 222 is a vertical type probe card with a guide plate parallel to the substrate so that probes can be arranged perpendicular to the surface of the test load board 200. The probes of the probe card 222 provide electrical signals to the DUT 202 and receive the resultant electrical signals provided from the DUT 202 as results. The results are communicated to the computing platform 208 and are stored in a load board database 224 of the memory 218.

Also in the testing phase, an RFID reader 226 reads an RFID tag 228 (e.g., the RFID tag 110 of FIG. 1). The RFID reader 226 wirelessly contacts the RFID tag 228 to feed an RF interrogating signal into the RFID tag 228 and receive an RF return signal generated in response to the RF interrogating signal. The RF return signal includes the identification information from the test load board 200 including a unique identifier. The identification information is received at an RFID interface 230.

Although described with respect to a single DUT for clarity, the test load board 200, the handler 206, in some examples, the tester 210 and the probe card 222, are configured to process multiple DUTs. The test load board manager 232 manages the testing of multiple DUTs in a lot contemporaneously. For example, FIG. 3 illustrates an example of an architecture for the test load board manager 300 (the test load board manager 232 of FIG. 2).

Figure 3:
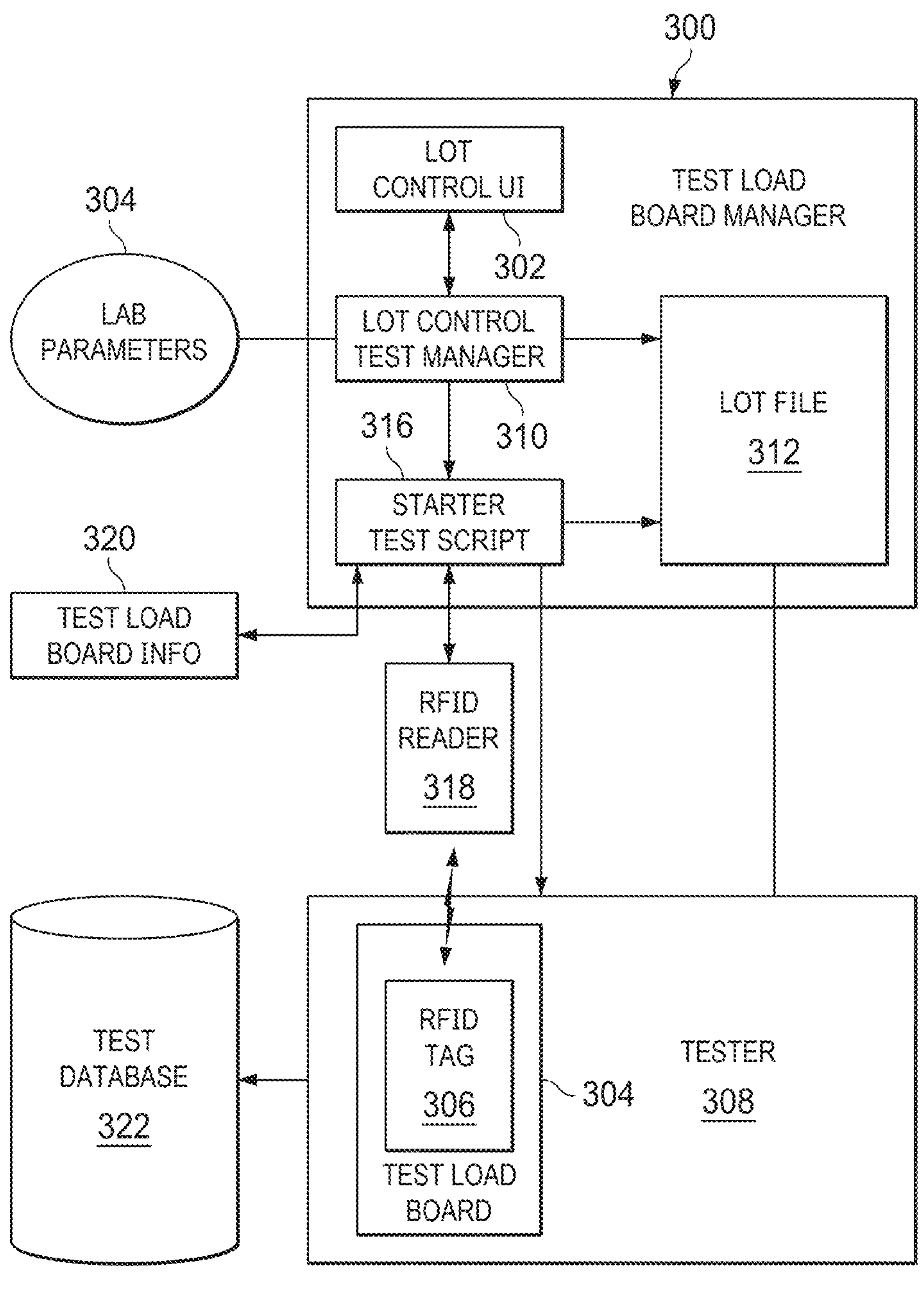
FIG. 3 illustrates an example of an architecture for the test load board manager.

Turning to FIG. 3, the test load board manager 300 includes a lot control user interface (UI) 302. A set of DUTs are defined as a lot, and the set of DUTs of the lot are divided into subsets of DUTs. The subsets of DUTs are defined as batches. The batches are processed in sequence. Accordingly, in some examples, individual batches include batch information about the subset of DUTs in the batch. The batch information is used for dispatching and tracking of DUTs in the subset of DUTs through the handling phase and testing phase. For example, a subset of DUTs of a batch may be loaded on test load board 304 (e.g., the test load board 100 of FIG. 1, the test load board 200 of FIG. 2) having an RFID tag 306 (e.g., the RFID tag 110 of FIG. 1, the RFID tag 228 of FIG. 2). In response to the test load board 304 being loaded in the tester 308 (e.g., the tester 210 of FIG. 2), the lot control UI 302 activates.

Figure 4:
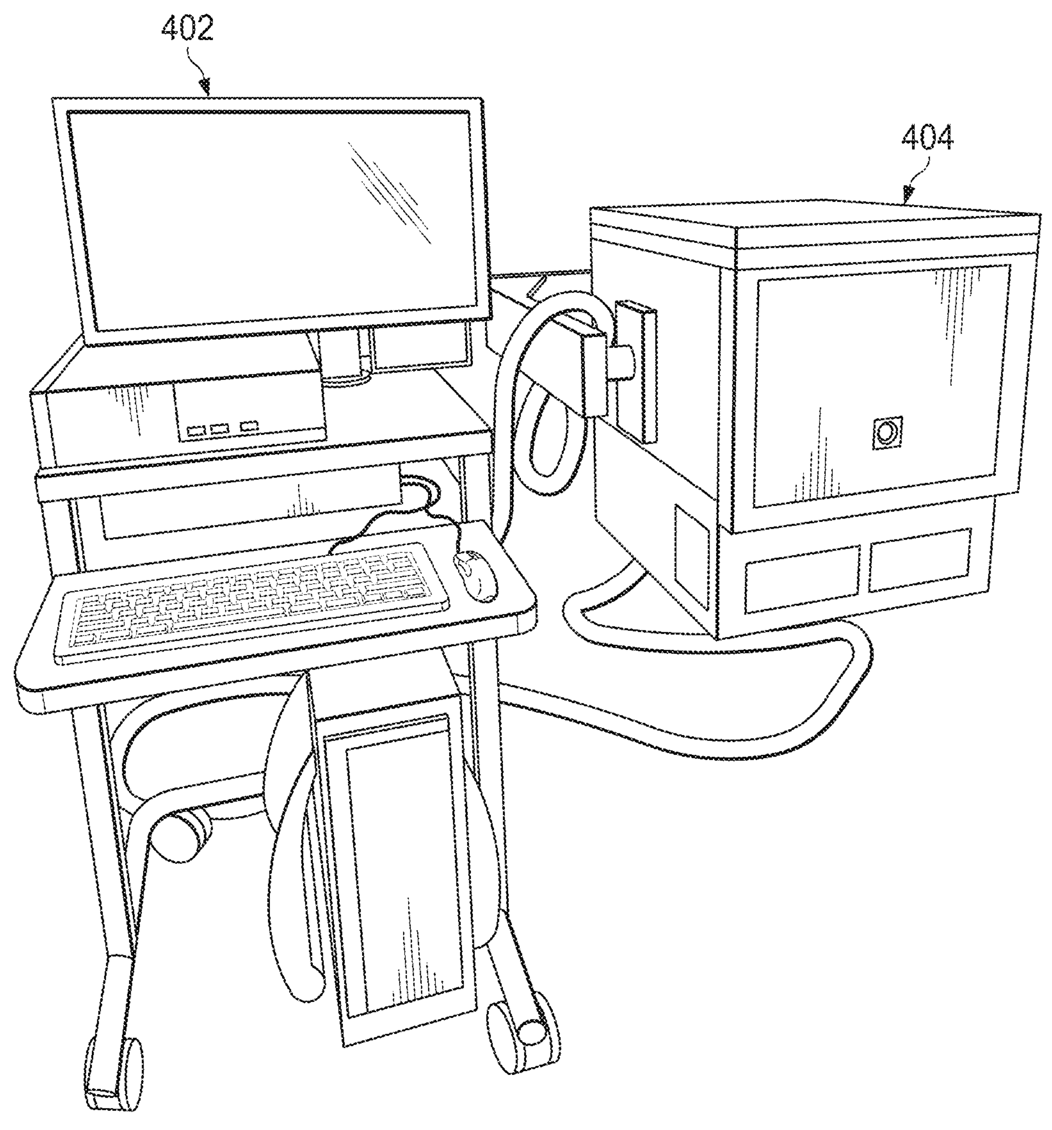
FIG. 4 illustrates an example of an interface for a computing platform and tester associated with a test load board with an RFID tag.

A user may interact with the lot control UI 302 via a computing platform (e.g., the computing platform 208 of FIG. 2). Turning to FIG. 4, the lot control UI 302 may be accessible using a display 402. The display 402 can receive input (e.g., touch input, keyboard input, input from various other input devices, etc.) from a user. The display 402 can be located in various locations relative to a tester 404 (e.g., the tester 210 of FIG. 2, the tester 308 of FIG. 3). For example, the display 402 is located remotely from the tester 404 or is a screen embedded in the tester 404.

Returning to FIG. 3, in response to being activated, the lot control UI 302 causes the lot control test manager 310 to load the batch information to the lot file 312. In addition to information about the batch of DUTs, in some examples, the batch information includes lab parameters 314 about the testing process (e.g., temperature ranges, applied voltage, desired output, etc.). The test load board manager 300 provides a query for the unique identifier of the test load board 304, such that a starter test script 316 causes the RFID reader 318 (e.g., the RFID reader 226 of FIG. 2) to query the RFID tag 306. The RFID reader 318 generates a wireless signal to query the RFID tag 306 on the test load board 304 responsive to receiving the query. The test load board manager 300 receives the unique ID for the test load board 304.

In some examples, the starter test script 316 also requests and/or receives test load board information 320. The test load board information 320 includes information about the location of components (e.g., the pads 104 of FIG. 1, the contactor pads 106, and/or the contact points 108 of FIG. 1) on the test load board 304, probe arrangement, etc. The test load board manager 300 adds the identification information, including the unique identifier, and the test load board information 320 to the lot file 312.

The test load board manager 300 provides the lot file 312 to the tester 308. In response to receiving the lot file 312, the tester 308 executes the test of a DUT. Once tested, the tester 308 writes the results of testing the DUTs, which are stored in a test database 322. In one example, the test database 322 includes a record of the test load board 304 based on the unique ID of the test load board 304. In some examples, the test load board manager 300 queries the test database 322 for the record of the test load board 304.

The results of the DUTs can be analyzed for batches of a lot of DUTs being tested on various test load boards. Because the test load board 304 has a unique ID, the test results can be mapped to a given test load board, such as the test load board 304, of a set of test load boards. In some examples, the test results for the set of test load boards also include the manufacturer for the given test load board. If batches tested on the test load board 304 have results that are statistically different than other batches of the lot, tested on other test load boards, the results are traceable to the test load board 304. For example, if the test results of batches of DUTs tested on the test load board 304 have a higher failure rate than batches of the lot tested on other test load boards, the test load board 304 is identified as having potential issues. In one example, the test load board 304 is identified as a defective test load board. Accordingly, issues with the test load board 304 are traceable to that specific test load board so that issues with the test load board 304 are not incorrectly attributed to the DUTs tested thereon. As another example, if the test results of batches of DUTs tested on the test load board 304 have a failure rate commensurate with batches of the lot tested on other test load boards, the test load board is identified as a trusted test load board. If during subsequent testing, a high percentage of a batch of DUTs tested on the test load board 304 fail, the status of the test load board 304 as a trusted test load board supports the test results. Accordingly, the failure of a high percentage of DUTs, even if improbable, is correctly attributable to the DUTs.

Figure 5:
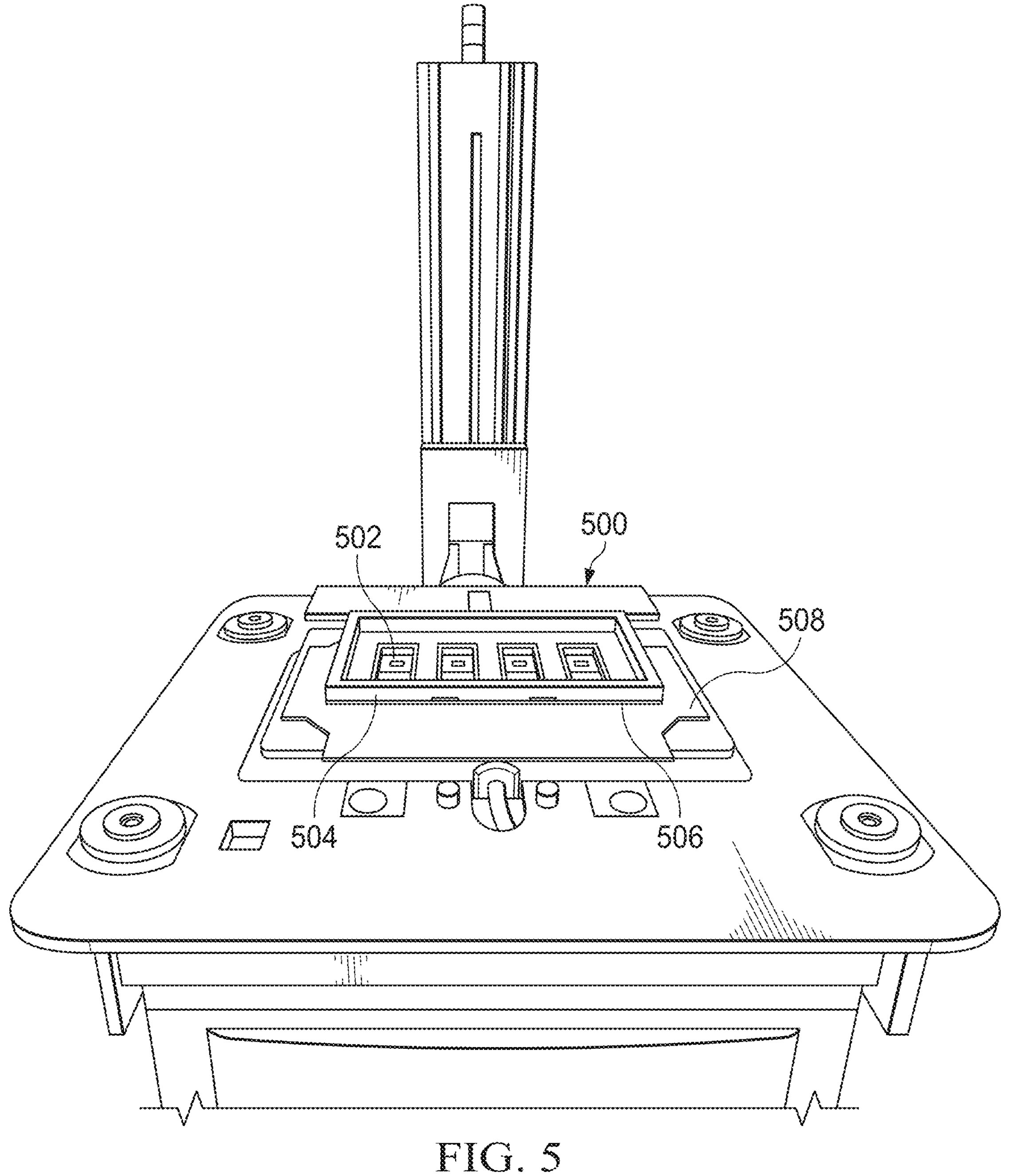
FIG. 5 illustrates a first view of an example test load board having sockets and a wall.
Figure 6:
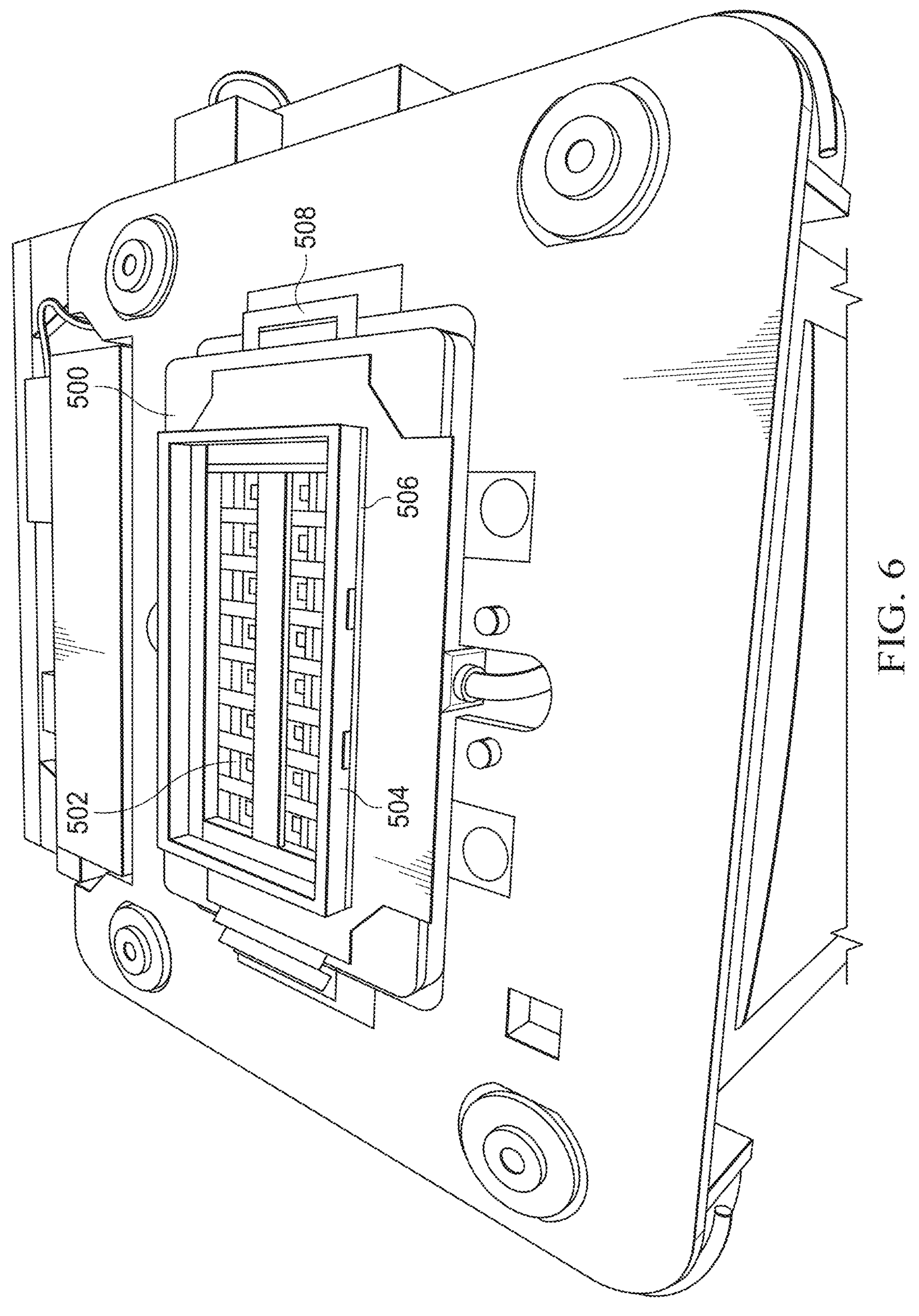
FIG. 6 illustrates a second view of the example test load board having sockets and the wall.

In some examples, a test load board 500 (e.g., the test load board 100 of FIG. 1, the test load board 200 of FIG. 2, the test load board 304 of FIG. 3) has a contactor 502 that is mounted on a set of contactor pads (e.g., the contactor pads 106 of FIG. 1) and a wall 504 circumscribing the contactor 502, as shown in FIGS. 5 and 6. The contactor 502 are affixed to a planar surface of the test load board 500. The planar surface extends in a first direction. The walls 504 extend from the edges of the test load board 500 in a second direction, approximately orthogonal to the first direction. The walls 504 protect the test load board 500 during interactions with a handler 700 (e.g., the handler 206 of FIG. 2) shown in FIG. 7 and a tester 800 (e.g., the tester 210 of FIG. 2, the tester 308 of FIG. 3, the tester 404 of FIG. 4) shown in FIG. 8.

Figure 7:
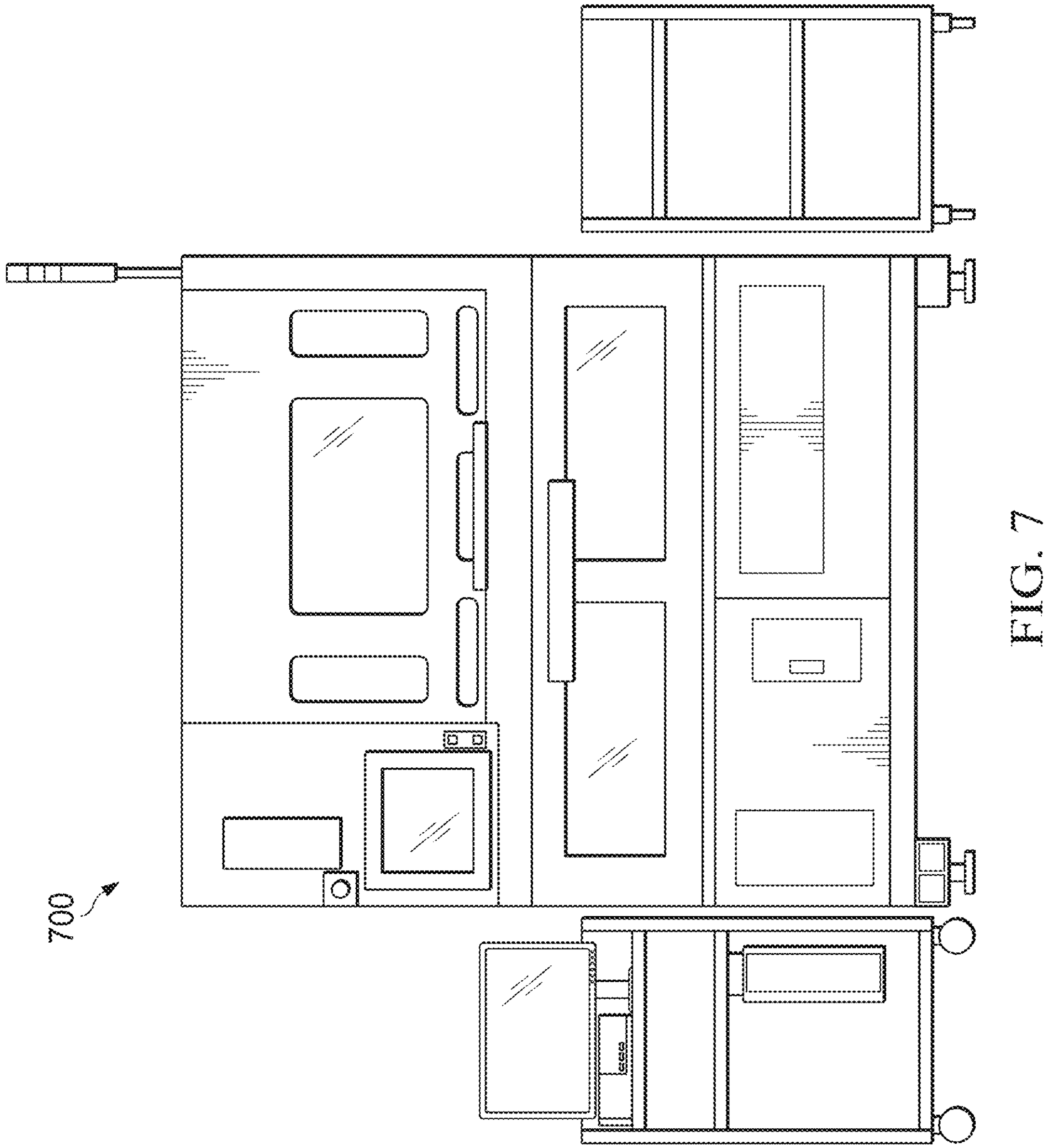
FIG. 7 illustrates an example of a handler for a test load board with an RFID tag.
Figure 8:
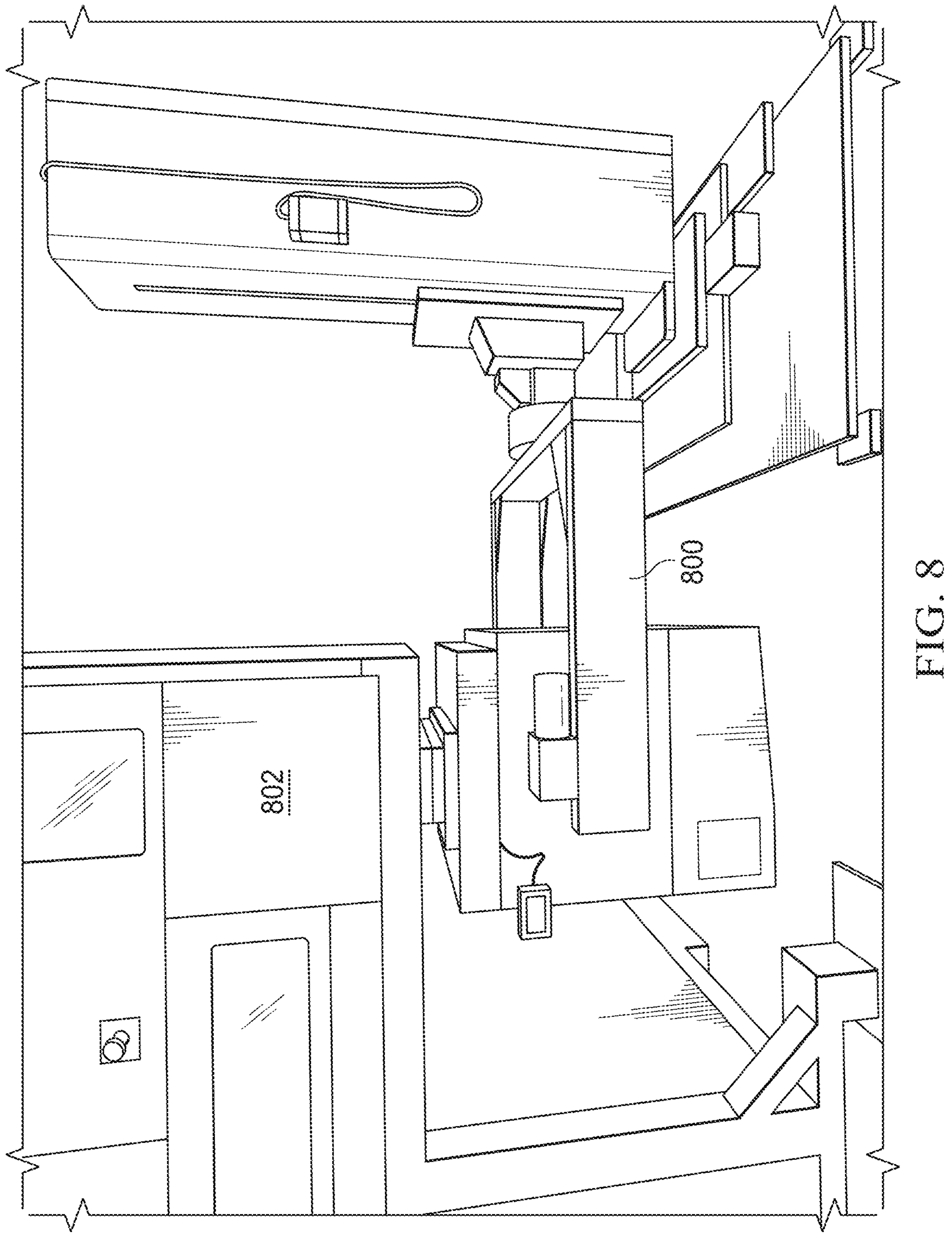
FIG. 8 illustrates an example of a handler and a tester for a test load board with an RFID tag.

Turning to FIGS. 7 and 8, the handler 700 receives the DUTs and loads the DUTs into sockets (e.g., the socket 204 of FIG. 2) of the set of contactors (e.g., the set of contactor pads 106 of FIG. 1). For example, the handler 700 depresses the DUTs into sockets of the test load board (e.g., the test load board 100 of FIG. 1, the test load board 200 of FIG. 2, the test load board 304 of FIG. 3, the test load board 500 of FIG. 5). The handler 700 holds the test load board with the loaded DUTs for testing. During testing, a tester 800, shown in FIG. 8, is positioned relative to the handler 802 (e.g., the handler 700 of FIG. 7). The tester 800 provides a probe to the pads (e.g., the pads 104 of FIG. 1) of the test load board positioned in the handler 802.

Returning to FIGS. 5 and 6, an antenna 506 (e.g., the antenna 112 of FIG. 1) is coupled to an RFID tag (e.g., the RFID tag 110 of FIG. 1, the RFID tag 228 of FIG. 2, the RFID tag 306 of FIG. 3). The antenna 506 is shaped to partially circumscribe the walls 504. The antenna 506 being separated from the surface of the test load board 500 by distance, corresponding to a height of the walls 504, reduces interference with components on the test load board 500. Additionally, the test load board 500 has a platform 508 for intermittent placement of an RFID reader (e.g., the RFID reader 226 of FIG. 2, the RFID reader 318 of FIG. 3). The platform 508 for the RFID reader is positioned to bring the RFID reader in wireless communicative proximity to the antenna 506.

Figure 9:
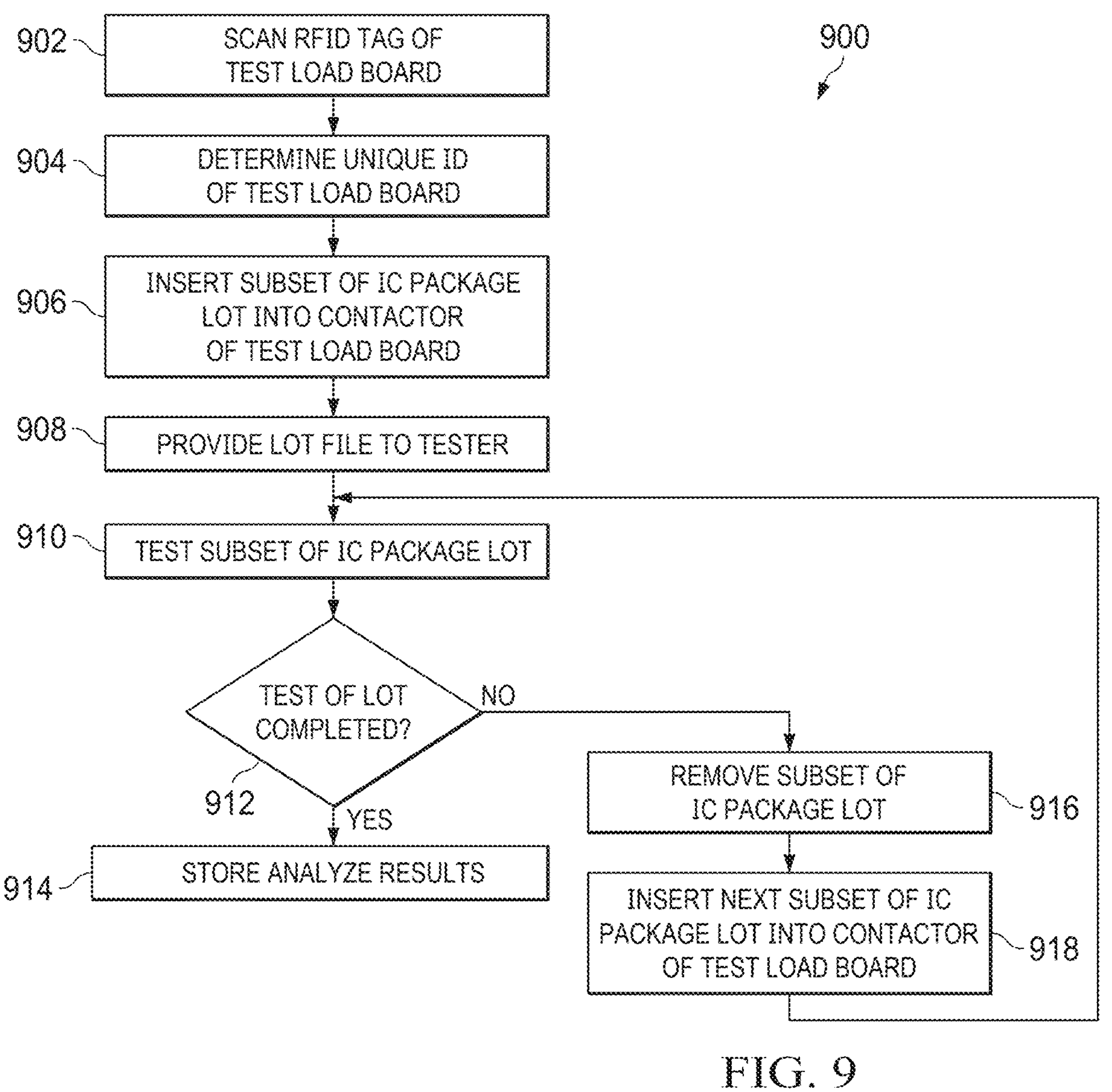
FIG. 9 illustrates a flowchart of an example method for testing a device under test (DUT) using a test load board with an RFID tag.

FIG. 9 illustrates a flowchart of an example method for testing a DUT (e.g., the DUT 202 of FIG. 2) using a test load board (e.g., the test load board 100 of FIG. 1, the test load board 200 of FIG. 2, the test load board 304 of FIG. 3, the test load board 500 of FIG. 5) with an RFID tag (e.g., the RFID tag 110 of FIG. 1, the RFID tag 228 of FIG. 2, the RFID tag 306 of FIG. 3).

At block 902, the RFID tag, mounted on the test load board, is scanned with a RFID reader (e.g., the RFID reader 226 of FIG. 2, the RFID reader 318 of FIG. 3). The test load board includes a PCB (e.g., the PCB 102 of FIG. 1) with pads (e.g., the pads 104 of FIG. 1) for a probe of a tester (e.g., the tester 210 of FIG. 2, the tester 308 of FIG. 3, the tester 404 of FIG. 4, the tester 800 of FIG. 8). The test load board also includes a contactor pads (e.g., the contactor pads 106 of FIG. 1) that includes contact points (e.g., contact points 108 of FIG. 1) for connecting leads of a DUT (e.g., the DUT of 202 of FIG. 2) for mounting a contactor (e.g., the 502 of FIG. 5).

At block 904, a test load board manager (e.g., the test load board manager 232 of FIG. 2, the test load board manager 300 of FIG. 3), operating on a computing platform (e.g., the computing platform 208 of FIG. 2), determines a unique ID of the load board based on the scanning. Also, adding, by the test load board manager, data characterizing the unique ID of the load test board to a lot file (e.g., the lot file 312 of FIG. 3) for testing a lot of DUTs. The lot is a set of DUTs that include a number of batches that includes a subset of the DUTs in the lot.

At block 906, a handler (e.g., the handler 206 of FIG. 2, the handler 700 of FIG. 7) inserts a first batch of DUTs (e.g., the DUT 202 of FIG. 2), such as IC packages, in the contactor (e.g., the contactor 502 of FIG. 5). For example, the handler exerts a force on the DUTs of the first batch to set the DUTs into sockets (e.g., the socket 204 of FIG. 2) of the contactors. In some examples, the batches include proper subsets of the set of DUTs in the lot such that a DUT of the lot is not included in more than one batch.

At block 908, the lot file is provided to the tester (e.g., the tester 210 of FIG. 2, the tester 308 of FIG. 3, the tester 404 of FIG. 4, the tester 800 of FIG. 8). At block 910, a batch, here the first batch, is tested by the tester in response to the lot file being provided to the tester. In response to testing, the tester writes results of the testing of the batch.

At block 912, the test load board manager 300 determines whether testing of the lot is complete. If so, the results are stored and analyzed at block 914. If testing of the lot is not complete, then additional batches of the lot remain to be tested. Accordingly, at block 916, the batch is removed, here the first batch, from the test load board. For example, the handler removes the DUT from the contactor of the test load board. At block 918, the next batch, for example a second batch, is inserted into the contactors of the load board. For example, the handler inserts the second batch of DUTs into the contactors of the test load board. The method 900 returns to block 910 and the second batch is tested. In this manner, the batches of the lot are sequentially tested in subsets of DUTs of the set of DUTs. If the results of the DUTs tested on the test load board are statistically different, for example surpass a failure rate threshold, then the test load board is identified as a defective test load board. Accordingly, issues with a given test load board are traceable such that the issues of the given test load board are identified and traced back to the given test load board, rather than being incorrectly attributed to the DUTs that were tested on the given test load board.

In this description, unless otherwise stated, "about," "approximately" or "substantially" preceding a parameter means being within +/−10 percent of that parameter. Modifications are possible in the described embodiments, and other embodiments are possible, within the scope of the claims.

What is claimed is:

1. A test load board comprising:

a PCB (printed circuit board) with pads for a probe of a tester;

a contactor that includes contact points for connecting leads of a DUT (device under test); and an RFID (radio frequency identification) tag affixed to the PCB, wherein the RFID tag is loaded with a unique identifier (ID) of the test load board.

2. The test load board of claim 1, wherein the RFID tag wirelessly transmits the unique ID of the test load board in response to a query from an RFID reader.

3. The test load board of claim 1, wherein the RFID tag is further loaded with a revision number and a manufacturing code for the test load board.

4. The test load board of claim 3, wherein the manufacturing code uniquely identifies a manufacturer of the test load board.

5. The test load board of claim 4, further comprising:

an antenna coupled to the RFID tag, wherein the antenna is shaped to circumscribe the contactor.

6. The test load board of claim 4, further comprising:

a wall circumscribing the contactor; and an antenna coupled to the RFID tag, wherein the antenna is shaped to partially circumscribe the wall.

7. The test load board of claim 6, further comprising:

a platform for intermittent placement of an RFID reader.

8. The test load board of claim 7, wherein the platform is positioned to bring the RFID reader in wireless communicative proximity to the antenna.

9. The test load board of claim 1, wherein the DUT is a plurality of DUTs, and the contactor includes sockets with contact points for the plurality of DUTs.

10. A non-transitory machine-readable medium having machine-readable instructions for a test load board manager causing a processor core to execute operations, the operations comprising:

providing a query for a unique ID (identifier) for a test load board to an RFID (radio frequency identifier) reader, wherein the RFID reader generates a wireless signal to query an RFID tag on the test load board responsive to receiving the query;

receiving the unique ID for the test load board in response to the providing; and querying a database for a record of the test load board based on the unique ID of the test load board.

11. The non-transitory machine-readable medium of claim 10, wherein the test load board is a given test load board the operations for the test load board manager further comprising:

determining a manufacture for the given test load board; and analyzing test results for a set of test load boards from the manufacturer and the given test load board.

12. The non-transitory machine-readable medium of claim 11, the operations of the test load board manager further comprising:

identifying a defective test load board based on the analyzing.

13. A method for testing integrated circuit (IC) packages, the method comprising:

scanning, with a RFID (radio frequency identification) reader, an RFID tag mounted on a test load board with a PCB (printed circuit board) with pads for a probe of a tester and a contactor that includes contact points for connecting a leads of a DUT (device under test);

determining, with test load board manager operating on a computing platform, a unique ID (identifier) of the test load board based on the scanning;

inserting, by a handler, an IC (integrated circuit) package into the contactor; and testing, by a tester, the inserted IC package.

14. The method of claim 13, wherein the IC package is a first IC package, the method further comprising:

removing, by the handler, the first IC package from the contactor;

inserting, by the handler, a second IC package in the contactor; and testing, by the tester, the second IC package inserted in the contactor.

15. A method for testing integrated circuit (IC) packages, the method comprising:

scanning, with a RFID (radio frequency identification) reader, an RFID tag mounted on a test load board with a PCB (printed circuit board) with pads for a probe of a tester and a contactor that includes contact points for connecting a leads of a DUT (device under test);

determining, with test load board manager operating on a computing platform, a unique ID (identifier) of the test load board based on the scanning;

inserting, by a handler, a first IC (integrated circuit) package in the contactor;

testing, by a tester, the first inserted IC package;

adding, by the test load board manager, data characterizing the unique ID of the load test board to a lot file for testing a lot of IC packages that includes the IC package;

providing, by the test load board manager, the lot file to the tester, wherein the testing is executed in response to the providing;

removing, by the handler, the first IC package from the contactor;

inserting, by the handler, a second IC package in the contactor; and testing, by the tester, the second IC package inserted in the contactor.

16. The method of claim 15, further comprising:

writing, by the tester, results of the testing of the IC package.

17. The method of claim 13, wherein the DUT is a subset of DUTs of a lot of DUTs, and contactor of the load test board includes sockets for the subset of the DUTs.

18. The method of claim 13, wherein the test load board further comprising:

a wall circumscribing the contactor; and an antenna coupled to the RFID tag, wherein the antenna is shaped to partially circumscribe the wall.

19. The method of claim 18, wherein the test load board further comprises a platform for the RFID reader, wherein the platform is positioned to bring the RFID reader in wireless communicative proximity to the antenna.

20. The method of claim 13, wherein the test load board further comprises an antenna coupled to the RFID tag, wherein the antenna is shaped to circumscribe the contactor.

* * * * *